(12) United States Patent
Chen et al.

(10) Patent No.: US 9,735,144 B2
(45) Date of Patent: Aug. 15, 2017

(54) ELECTROSTATIC DISCHARGE (ESD) PROTECTION DEVICE

(71) Applicant: MediaTek Inc., Hsin-Chu (TW)

(72) Inventors: Shih-Fan Chen, Tainan (TW); Tai-Hsiang Lai, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/014,685

(22) Filed: Feb. 3, 2016

(65) Prior Publication Data

US 2016/0240524 A1     Aug. 18, 2016

Related U.S. Application Data

(60) Provisional application No. 62/114,662, filed on Feb. 11, 2015.

(51) Int. Cl.
| | | |
|---|---|---|
| *H01L 27/02* | (2006.01) | |
| *H01L 29/08* | (2006.01) | |
| *H01L 29/73* | (2006.01) | |
| *H01L 29/06* | (2006.01) | |
| *H01L 27/12* | (2006.01) | |
| *H01L 27/07* | (2006.01) | |
| *H01L 27/08* | (2006.01) | |
| *H01L 21/762* | (2006.01) | |

(52) U.S. Cl.
CPC .... *H01L 27/0259* (2013.01); *H01L 21/76224* (2013.01); *H01L 27/0255* (2013.01); *H01L 27/0711* (2013.01); *H01L 27/0814* (2013.01); *H01L 27/1203* (2013.01); *H01L 29/0649* (2013.01); *H01L 29/0804* (2013.01); *H01L 29/0821* (2013.01); *H01L 29/73* (2013.01)

(58) Field of Classification Search
CPC ............ H01L 27/0259; H01L 27/0711; H01L 27/0255; H01L 27/0814; H01L 27/1203; H01L 29/0649; H01L 29/0804; H01L 29/0821; H01L 29/73; H01L 21/76224
USPC ....... 257/183, 337, 339, 343, 355, 360, 526, 257/E29.174, E29.195, E29.256, E27.06, 257/E27.051, E27.112, E21.049, E21.417, 257/E21.37; 438/139, 236, 294
See application file for complete search history.

(56) References Cited

U.S. PATENT DOCUMENTS

2003/0201498 A1* 10/2003 Hu ................ H01L 27/027
257/355
2007/0267700 A1* 11/2007 Russ ................ H01L 27/0255
257/355

(Continued)

*Primary Examiner* — Dao H Nguyen
(74) *Attorney, Agent, or Firm* — McClure, Qualey & Rodack, LLP

(57) ABSTRACT

An electrostatic discharge (ESD) protection device includes a semiconductor layer having a first doped region, a second doped region, and an intrinsic region formed therein, and a plurality of insulating elements respectively formed therein. The plurality of insulating elements is respectively formed in a portion of the semiconductor layer between the first, second and third doped regions. The intrinsic region is formed at least in the semiconductor layer between one of the second and third regions and the other one of the second and third regions or between one of the second and third regions and the first region. The first doped region is formed with a first conductivity type, and the second and third doped regions are formed with a second conductivity type opposite to the first conductivity type.

24 Claims, 11 Drawing Sheets

(56) References Cited

U.S. PATENT DOCUMENTS

| | | | |
|---|---|---|---|
| 2013/0341675 A1* | 12/2013 | Lai | H01L 29/7436 257/147 |
| 2014/0117444 A1* | 5/2014 | Liu | H01L 27/088 257/337 |
| 2016/0079750 A1* | 3/2016 | Edwards | H01L 27/0255 257/146 |

* cited by examiner

ELECTROSTATIC DISCHARGE (ESD) PROTECTION DEVICE

CROSS REFERENCE TO RELATED APPLICATIONS

This application claims the benefit of U.S. Provisional Application No. 62/114,662 filed Feb. 11, 2015, the entirety of which is incorporated by reference herein.

BACKGROUND OF THE INVENTION

Field of the Invention

The present invention relates to protection devices for integrated circuits (ICs), and in particular to electrostatic discharge (ESD) protection devices for integrated circuits (ICs).

Description of the Related Art

The semiconductor integrated circuit (IC) industry has experienced rapid growth. Technological advances in IC materials and design have produced generations of ICs where each generation has smaller and more complex circuits than the previous generation. These circuits may be sensitive to electrostatic discharge (ESD) currents. Thus, ESD protection devices are utilized to prevent and reduce damage to an IC caused by ESD currents.

Conventionally, n-type metal oxide semiconductor (NMOS) transistors have been widely used as primary component in ESD protection circuit in semiconductor integrated circuit devices. However, while existing n-type metal oxide semiconductor (NMOS) transistors functioning as ESD protection devices have been generally adequate for their intended purposes, they have not been entirely satisfactory in every respect.

BRIEF SUMMARY OF THE INVENTION

An exemplary electrostatic discharge (ESD) protection device comprises a semiconductor layer having a first doped region, a second doped region, a third doped region, and an intrinsic region formed therein, and a plurality of insulating elements respectively formed therein. The first doped region is formed in a first portion of the semiconductor layer and the second doped region is formed in a second portion of the semiconductor layer. The third doped region is formed in a third portion of the semiconductor layer, and the plurality of insulating elements is respectively formed over a portion of the semiconductor layer between the first, second and third doped regions. The intrinsic region is formed at least in the semiconductor layer between one of the second and third portions of the semiconductor layer and the other one of the second and third portions of the semiconductor layer in the semiconductor layer or between one of the second and third portions of the semiconductor layer and the first portion of the semiconductor layer. The first doped region is formed with a first conductivity type, and the second and third doped regions are formed with a second conductivity type opposite to the first conductivity type.

In some embodiments, the exemplary electrostatic discharge (ESD) protection device further comprises a first well region, a second well region, and a third well region. The first well region is formed in a fourth portion of the semiconductor layer under the first portion of the semiconductor layer, and the second well region is formed in a fifth portion of the semiconductor layer under the second portion of the semiconductor layer. The third well region is formed in a sixth portion of the semiconductor layer under the third portion of the semiconductor layer. The first well region is formed with the first conductivity type or comprises the intrinsic region, and the second well region is formed with the first conductivity type or comprises the intrinsic region, and the third well region is formed with the first conductivity type, the second conductivity type or comprises the intrinsic region.

In some embodiments, the exemplary electrostatic discharge (ESD) protection device further comprises a fifth well region and a sixth well region. The fifth well region formed in a seventh portion of the semiconductor layer between the first and second well regions. The sixth well region formed in an eighth portion of the semiconductor layer between the second and third well regions. The fifth well region is formed with the first conductivity type or comprises the intrinsic region, and the sixth well region is formed with the first conductivity type or comprises the intrinsic region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
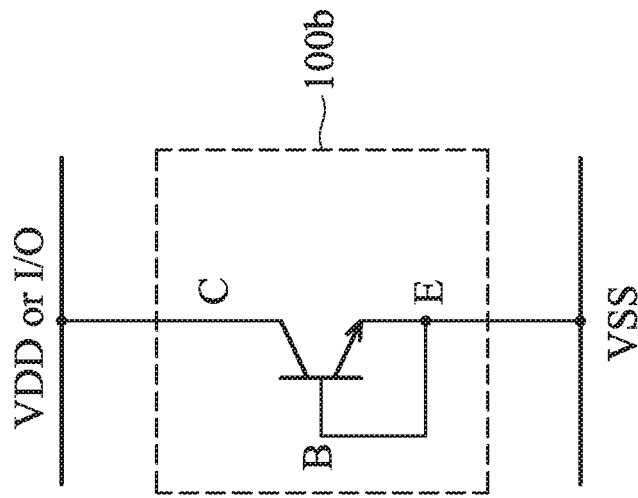
FIG. 2 shows an electrostatic discharge (ESD) protection circuit according to another embodiment of the invention.
Figure 1:
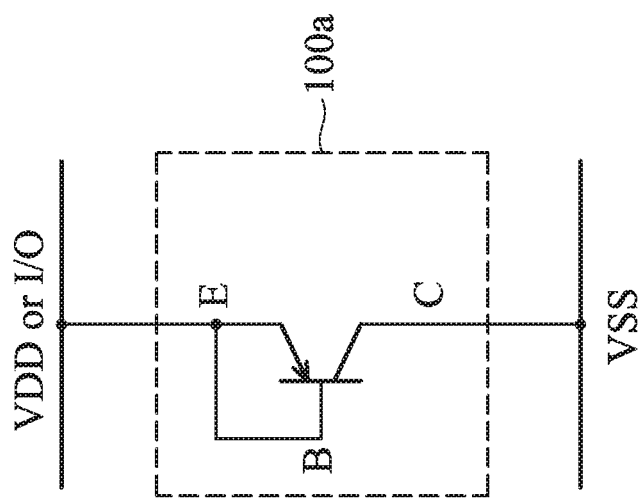
FIG. 1 shows an electrostatic discharge (ESD) protection circuit according to an embodiment of the invention.

FIGS. 1-2 are schematic diagrams respectively showing an exemplary electrostatic discharge (ESD) protection circuit of the invention.

As shown in FIG. 1, the exemplary electrostatic discharge (ESD) protection circuit is provided with a P-N-P bipolar junction transistor (BJT) 100a having a base B, an emitter E and a collector C for functioning as an ESD protection device. In this embodiment, the base B is shorted with the emitter E such that the base B and the emitter E are electrically connected to either a VDD node or an input/output (I/O) node of an integrated circuit device (not shown), and the collector C is electrically connected to a VSS node of the integrated circuit device.

In addition, as shown in FIG. 2, in another embodiment, an exemplary electrostatic discharge (ESD) protection circuit is provided with a N-P-N bipolar junction transistor (BJT) 100b having a base B, an emitter E and a collector C for functioning as an ESD protection device. In this embodiment, the base B is shorted with the emitter E such that the base B and the emitter E are electrically connected to a VSS node of an integrated circuit device (not shown), and the collector C is electrically connected to either a VDD node or an input/output (I/O) node of an integrated circuit device.

During an ESD event, sufficient amount of charge builds up in the integrated circuit device and causes the ESD protection device (e.g. the P-N-P bipolar junction transistor (BJT) 100a shown in FIG. 1 or N-P-N bipolar junction transistor (BJT) 100B shown in FIG. 2) to rapidly break down and conduct current with a low intrinsic resistance. The rapid conduction of the ESD protection component causes charges on the VDD node or the I/O node of the integrated circuit device to discharge to the VSS node through the P-N-P bipolar junction transistor (BJT) 100a shown in FIG. 1 or N-P-N bipolar junction transistor (BJT) 100B shown in FIG. 2. This action prevents the excessive charges to damage the integrated circuit.

Figure 3:
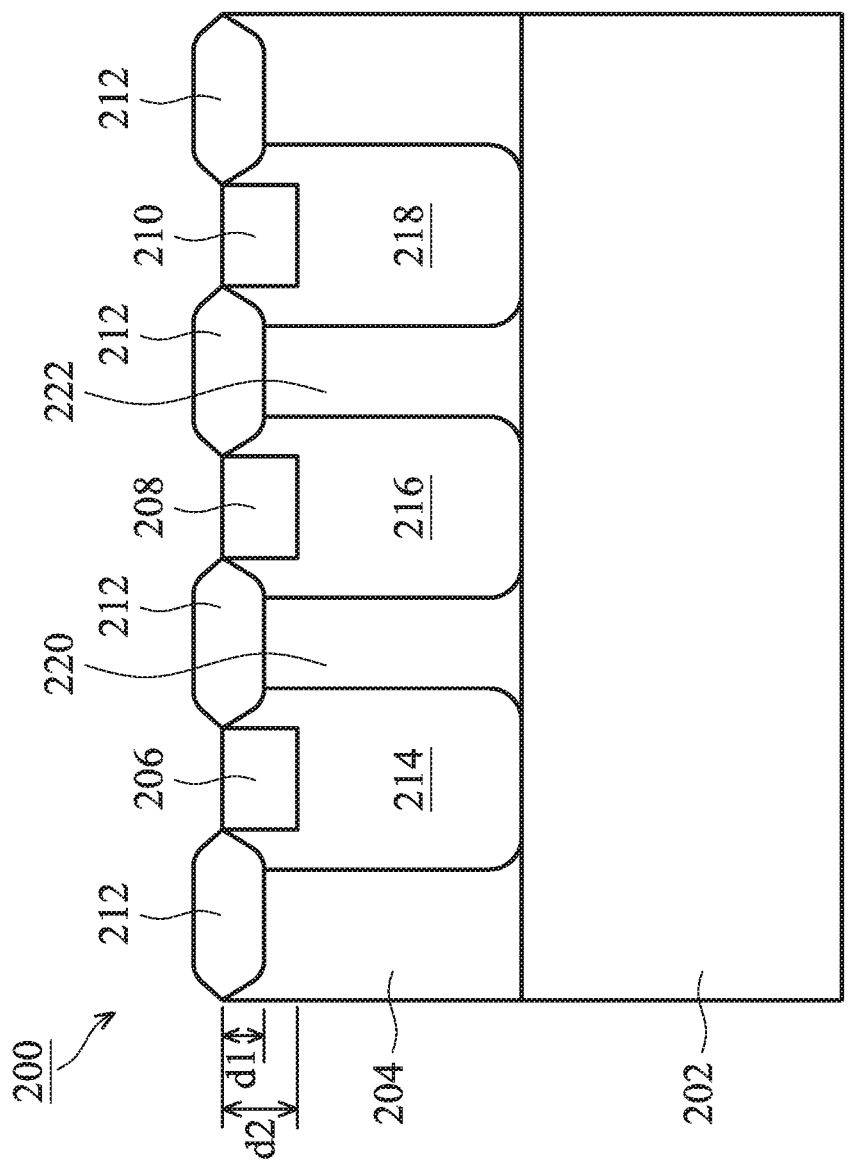
FIG. 3 is a schematic cross section showing an electrostatic discharge (ESD) protection device according to an embodiment of the invention.

FIG. 3 is a schematic cross section showing an exemplary electrostatic discharge (ESD) protection device 200 can be used in both of the P-N-P bipolar junction transistor (BJT) 100a shown in FIG. 1 and the N-P-N bipolar junction transistor (BJT) 100b shown in FIG. 2.

As shown in FIG. 3, the ESD protection device 200 comprises a semiconductor substrate 202 having a semiconductor layer 204 formed thereon. The semiconductor layer 204 can be a part of the semiconductor substrate 202, or the semiconductor layer 204 can be an epitaxial layer additionally formed over the semiconductor substrate 202. In some embodiments, the semiconductor substrate 202 and the semiconductor layer 204 may comprise semiconductor materials such as silicon. In some embodiments, the semiconductor substrate 202 can be, for example, a P-type silicon wafer, and the semiconductor layer 204 can be, for example, a P-type doped layer. In addition, the ESD protection device 200 may further comprise a first doped region 206, a second doped region 208, and a third doped region 210 respectively formed in a different portion of the semiconductor layer 204.

Moreover, a plurality of insulating elements 212 are respectively formed over a portion of the semiconductor layer 204 between the first doped region 206, the second doped region 208 and the third doped region 210, and a portion of the semiconductor layer 204 adjacent to a side of the first doped region 206 and the third doped region 210 to isolate the first doped region 206, the second doped region 208, and the third doped region 210 from each other. In some embodiments, the first doped region 206 is formed with a first conductivity type, and the second doped region 208 and third doped region 210 are formed with a second conductivity type opposite to the first conductivity type. In this embodiment, the insulation elements 212 can be field oxide (FOX) elements made of insulating materials such as silicon oxide. The insulation elements 212 may have a depth d1 in the semiconductor layer 204 which is less than a depth d2 of the first doped region 206, the second doped region 208 and the third doped region 210 in the semiconductor layer 204.

Moreover, the ESD protection device 200 may further comprise a first well region 214 formed in a portion of the semiconductor layer 204 under the first doped region 206 and a portion of the insulating elements 212 adjacent thereto, a second well region 216 formed in a portion of the semiconductor layer 204 under the second doped region 208 and a portion of the insulating elements 212 adjacent thereto, and a third well region 218 formed in a portion of the semiconductor layer 204 under the third doped region 210 and a portion of the insulating elements 212 adjacent thereto. Moreover, the ESD protection device 200 may further comprise a fourth well region 220 formed in a portion of the semiconductor layer 204 between the first well region 214 and the second well region 216 and under portions of the insulating elements 212 adjacent to the first well region 214 and the second well region 216, and a fifth well region 222 formed in a portion of the semiconductor layer 204 between the second well region 216 and the third well region 218 and under portions the insulating elements 212 adjacent to the second well region 216 and the third well region 218.

In some embodiments, the first well region 214 may be formed with the first conductivity type or comprises an intrinsic region without n-type or p-type doping therein. In some embodiments, the second well region 216 may be formed with the first conductivity type or comprises an intrinsic region without n-type or p-type doping therein. In some embodiments, the third well region 218 may be formed with the first conductivity type or the second conductivity type, or comprises an intrinsic region without n-type or p-type doping therein. In some embodiments, the fourth well region 220 may be formed with the first conductivity type or comprises an intrinsic region without n-type or p-type doping therein. In some embodiments, the fifth well region 222 may be formed with the first conductivity type or comprises an intrinsic region without n-type or p-type doping therein. In some embodiments, the first doped region 206, the second doped region 208, and the third doped region 210 may have a doping concentration about 100 times or more greater than a doping concentration in the first well region 214, the second well region 216, the third well region 218, the fourth well region 220 and the fifth well region 222. In some embodiments, the first well region 214, the second well region 216, and the third well region 218 may have a doping concentration the same as or greater than a doping concentration of the fourth well region 220 and the fifth well region 222. In some embodiments, the fourth well region 220 and the fifth well region 222 may have a doping concentration about 0.1 times or more less than a doping concentration of the first well region 214, the second well region 216, and the third well region 218.

In some embodiments, the ESD protection device 200 shown in FIG. 3 may function as the P-N-P bipolar junction transistor (BJT) 100a shown FIG. 1, and the first conductivity type is N-type and the second conductivity type is P-type, such that the first doped region 206 may function as the base B of the P-N-P bipolar junction transistor (BJT) 100a shown FIG. 1, and one of the second doped region 208 and the third doped region 210, such as the second doped region 208 may function as the emitter E of the P-N-P bipolar junction transistor (BJT) 100a shown FIG. 1, and the other one of the second doped region 208 and the third doped region 210, such as the third doped region 210 may function as the collector C of the P-N-P bipolar junction transistor (BJT) 100a shown FIG. 1. In this embodiment, a well region 224 may be optionally formed in a portion of the semiconductor substrate 202 underlying the first well region 214, the second well region 216, the third well region 218, the fourth well region 220 and the fifth well region 222, see FIG. 4. At this time, the well region 224 is formed with the first conductive type.

In some embodiments, the ESD protection device 200 shown in FIG. 3 may function as the N-P-N bipolar junction transistor (BJT) 100b shown FIG. 2, and the first conductivity type is P-type and the second conductivity type is N-type, such that the first doped region 206 may function as the base B of the N-P-N bipolar junction transistor (BJT) 100b shown FIG. 2, and one of the second doped region 208 and the third doped region 210, such as the second doped region 208 may function as the emitter E of the N-P-N bipolar junction transistor (BJT) 100b shown FIG. 2, and the other one of the second doped region 208 and the third doped region 210, such as the third doped region 210 may function as the collector C of the N-P-N bipolar junction transistor (BJT) 100b shown FIG. 2.

In some embodiments, the ESD protection device 200 shown in FIG. 3 may comprise at least one intrinsic region (e.g. at least one of the first well region 214, the second well region 216, the third well region 218, the fourth well region 220, and the fifth well region 222) formed between one of the second doped region 208 and the third doped region 210 and the other one of the second doped region 208 and the third doped region 210 or between one of the second doped region 208 and the third doped region 210 and the first doped region 206. In some embodiments, the ESD protection device 200 shown in FIG. 3 may comprise at least two or more intrinsic regions (e.g. at least two or more of the first well region 214, the second well region 216, the third well region 218, the fourth well region 220, and the fifth well region 222) formed between one of the second doped region 208 and the third doped region 210 and the other one of the second doped region 208 and the third doped region 210 or between one of the second doped region 208 and the third doped region 210 and the first doped region 206. Due to the formation of the at least one intrinsic region formed in the semiconductor layer 204, a breakdown voltage the ESD protection device 200 shown in FIG. 3 can thus be increased to a level higher than, for example, 10 volts, so that the electrostatic discharge (ESD) protection circuit shown in FIGS. 1-2 using the ESD protection device 200 shown in FIG. 3 can be applied to protect high-voltage integrated circuit (HV IC) device such as analog IC devices, power management IC devices, or the like. In addition, the ESD protection device 200 shown in FIG. 3 can be formed with a smaller layout area than that of the NMOS transistors used as ESD protection components. Moreover, the transmission line pulse (TLP) curve of the ESD protection device 200 shown in FIG. 3 shows no-snapback, which is desired.

Figure 4:
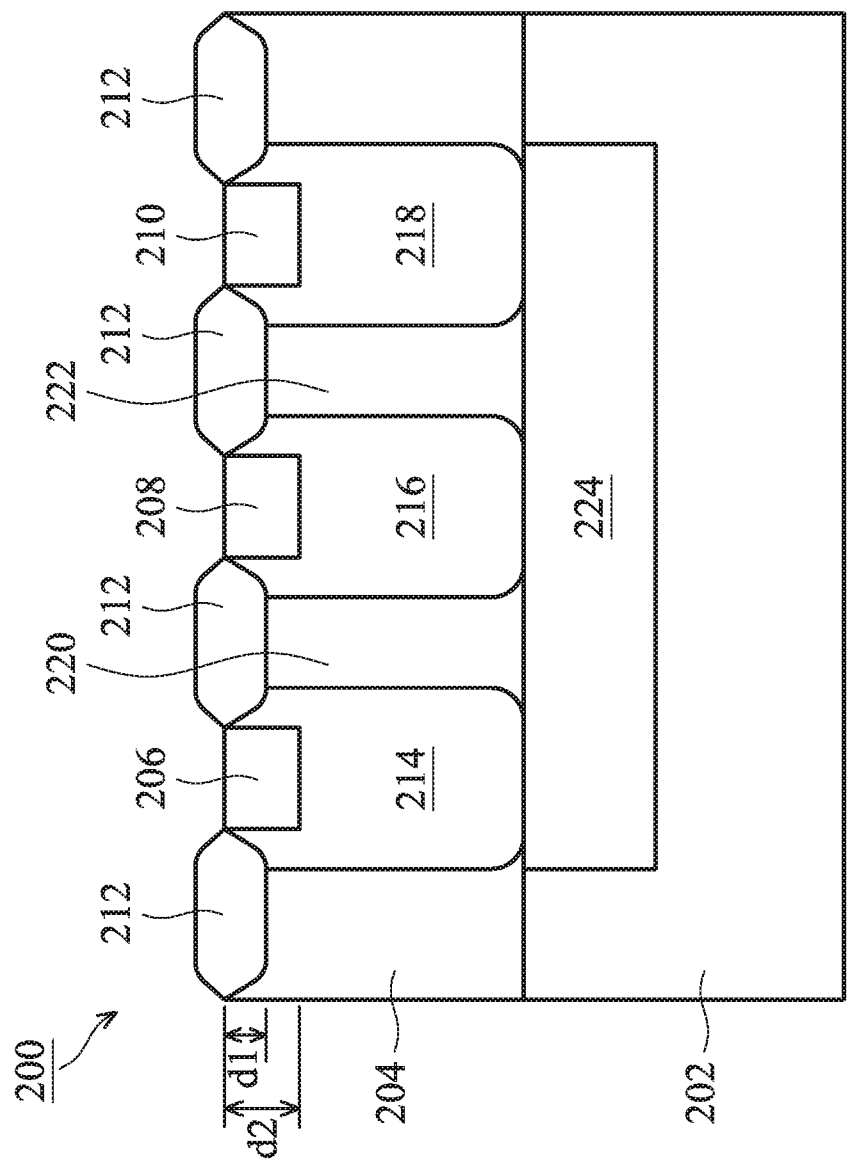
FIG. 4 is a schematic cross section showing an electrostatic discharge (ESD) protection device according to another embodiment of the invention.
Figure 5:
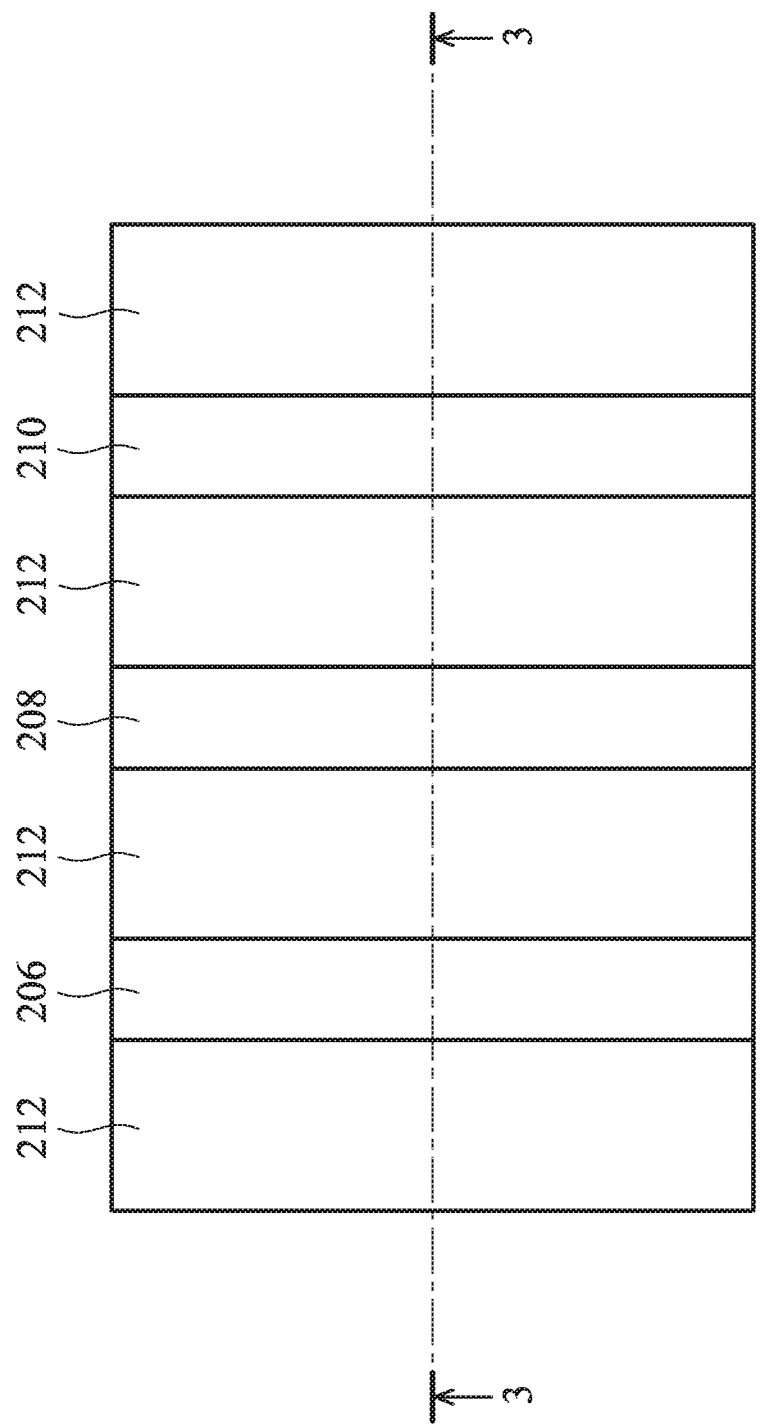
FIG. 5 is a schematic top view showing an electrostatic discharge (ESD) protection device according to an embodiment of the invention.

FIG. 5 shows a schematic top view of the ESD protection device 200 shown in FIGS. 3 and 4, and the schematic cross sections shown in FIGS. 3 and 4 are taken along line 3-3 in FIG. 5.

In some embodiments, locations of the first doped region 206 and the first well region 214 under the first doped region 206, the second doped region 208 and the second well region 216 under the second doped region 208, and the third doped region 210 and the third well region 218 under the third doped region 210 of the ESD protection device 200 shown in FIGS. 3 and 4, however, can be arbitrarily adjusted and are not limited to that disclosed in FIGS. 3 and 4.

Figure 6:
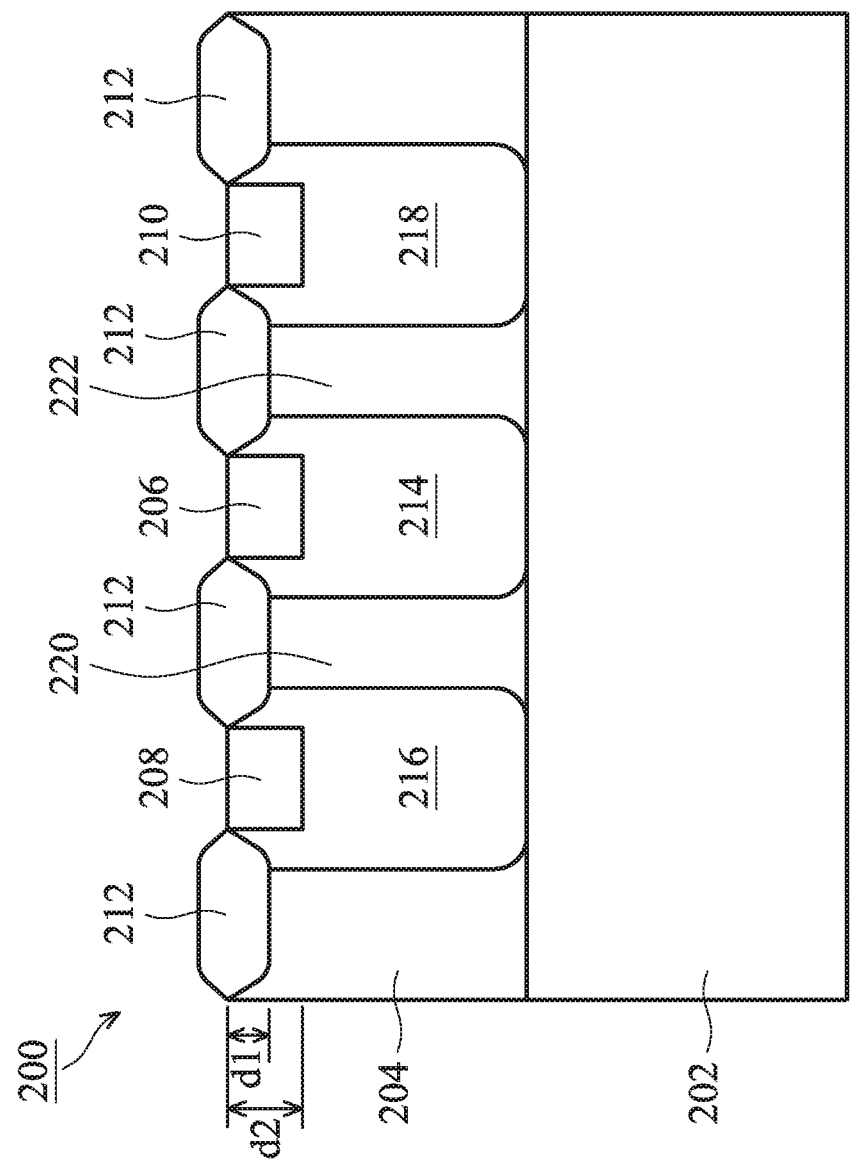
FIG. 6 is a schematic cross section showing an electrostatic discharge (ESD) protection device according to yet another embodiment of the invention.

For example, in some embodiments, the locations of the first doped region 206 and the first well region 214 under the first doped region 206, and the second doped region 208 and the second well region 216 under the second doped region 208 shown in FIGS. 3 and 4 can be exchanged, see FIG. 6.

Figure 7:
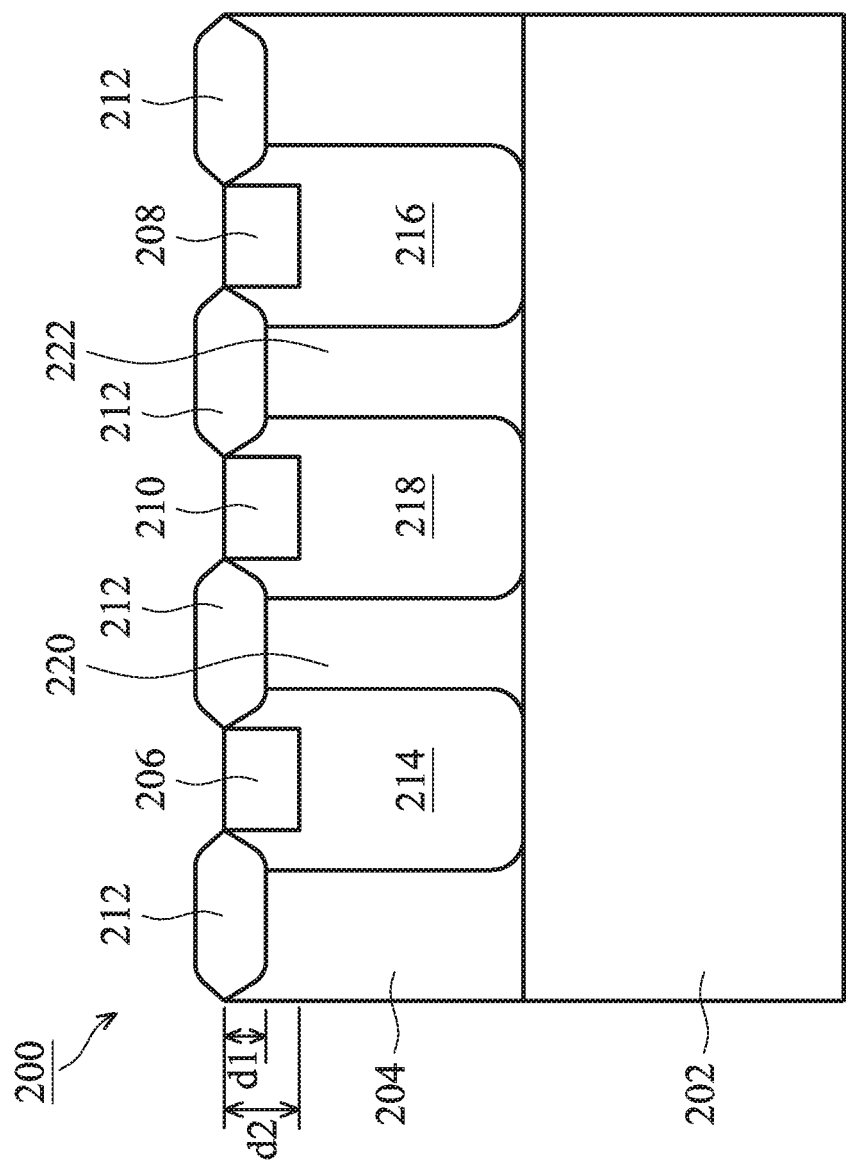
FIG. 7 is a schematic cross section showing an electrostatic discharge (ESD) protection device according to another embodiment of the invention.
Figure 8:
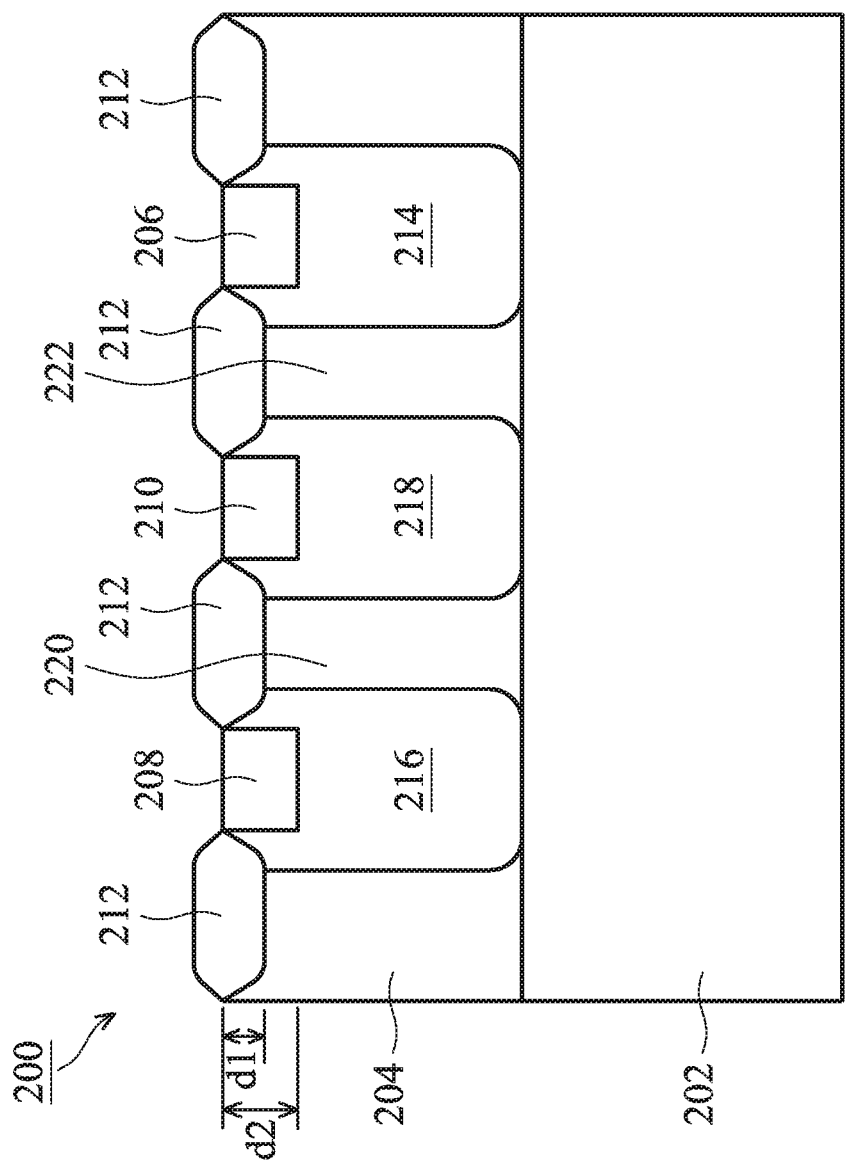
FIG. 8 is a schematic cross section showing an electrostatic discharge (ESD) protection device according to yet another embodiment of the invention.

Moreover, in some embodiments, the locations of the third doped region 210 and the third well region 218 under the third doped region 210 of the ESD protection device 200 shown in FIGS. 3 and 4 can be changed to be disposed in the semiconductor layer 204 between the first doped region 206 and the first well region 214 under the first doped region 206, and the second doped region 208 and the second well region 216 under the second doped region 208, see FIG. 7. Similarly, in some embodiments, the locations of the first doped region 206 and the first well region 214 under the first doped region 206, and the second doped region 208 and the second well region 216 under the second doped region 208 formed on the opposite sides of the third doped region 210 and the third well region 218 may be exchanged, see FIG. 8.

Figure 9:
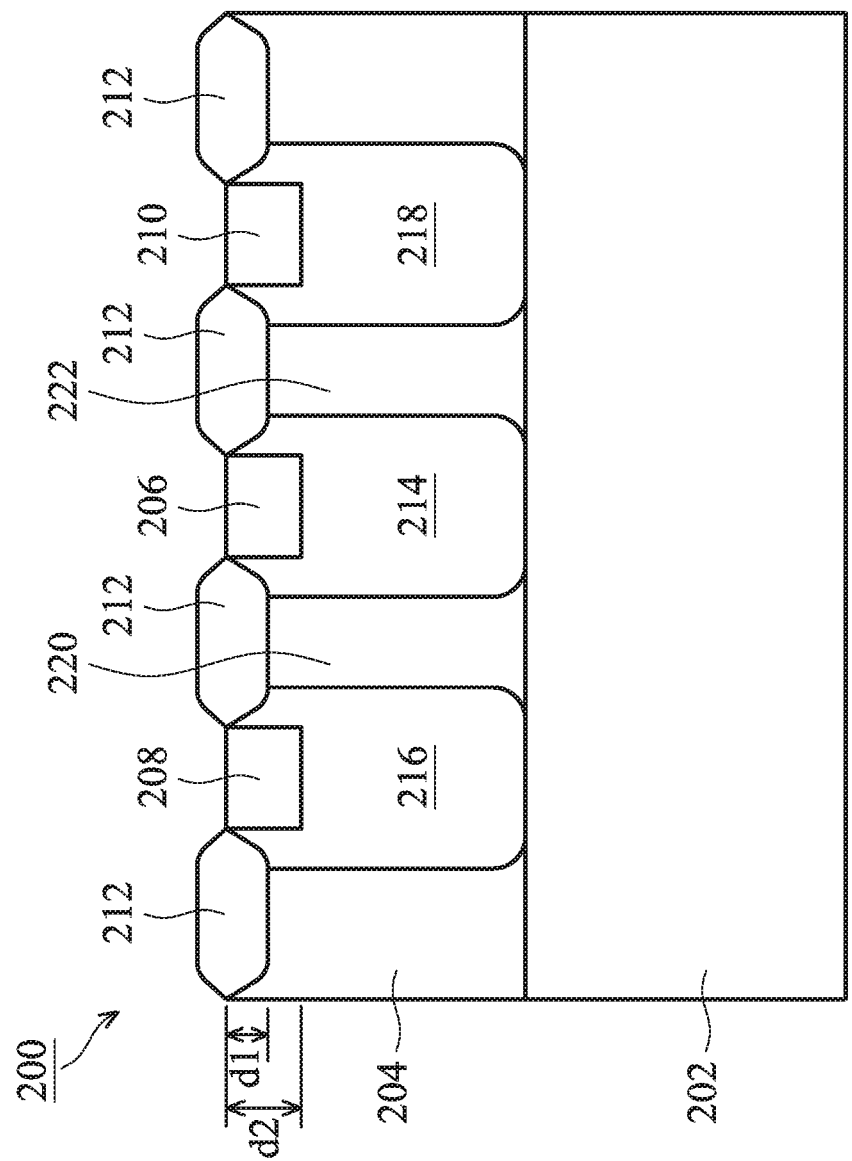
FIG. 9 is a schematic cross section showing an electrostatic discharge (ESD) protection device according to another embodiment of the invention.
Figure 10:
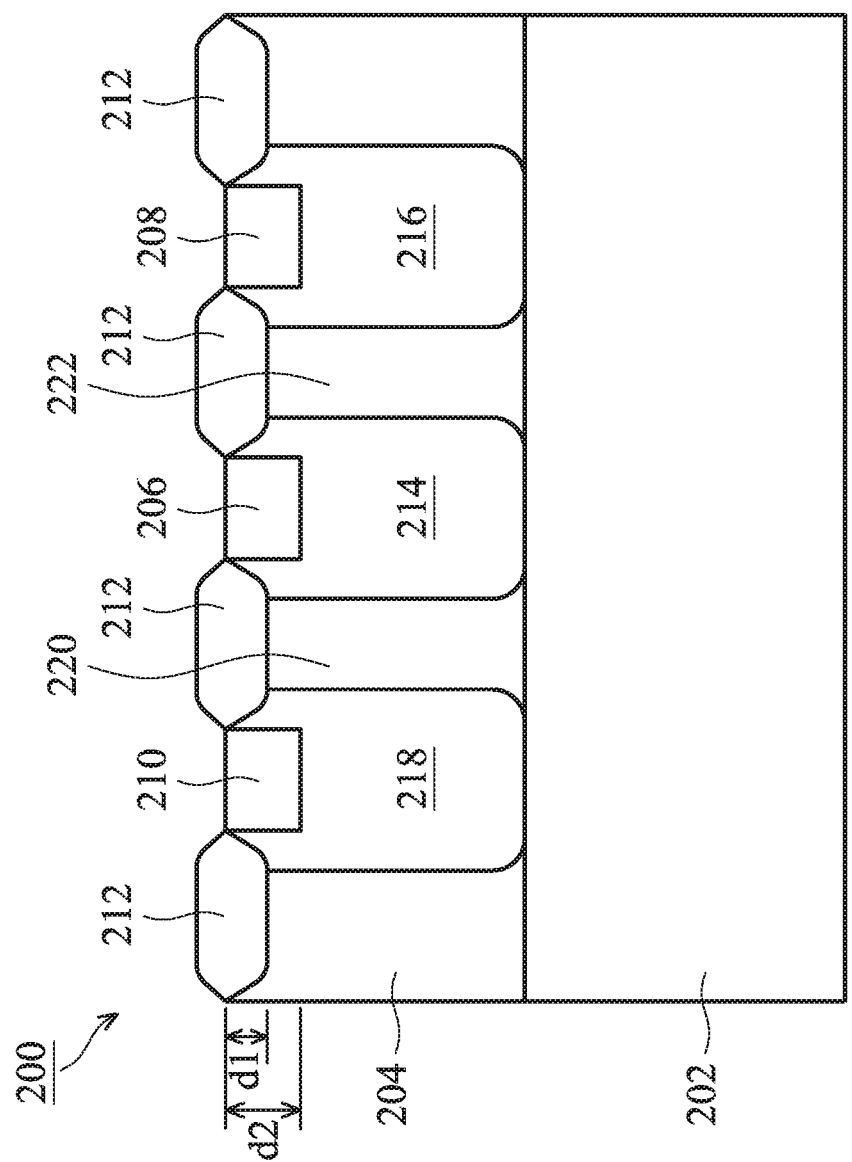
FIG. 10 is a schematic cross section showing an electrostatic discharge (ESD) protection device according to yet another embodiment of the invention.

In addition, in some embodiments, the locations of the first doped region 206 and the first well region 214 under the first doped region 206 of the ESD protection device 200 shown in FIGS. 3 and 4 can be changed to be disposed in the semiconductor layer 204 between the second doped region 208 and the second well region 216 under the second doped region 208, and the third doped region 210 and the third well region 218 under the third doped region 210, see FIG. 9. Similarly, in some embodiments, the locations of the third doped region 210 and the third well region 218 under the third doped region 210, and the second doped region 208 and the second well region 216 under formed under the second doped region 208 on opposite sides of the first doped region 206 and the first well region 214 thereunder may be exchanged, see in FIG. 10.

Figure 11:
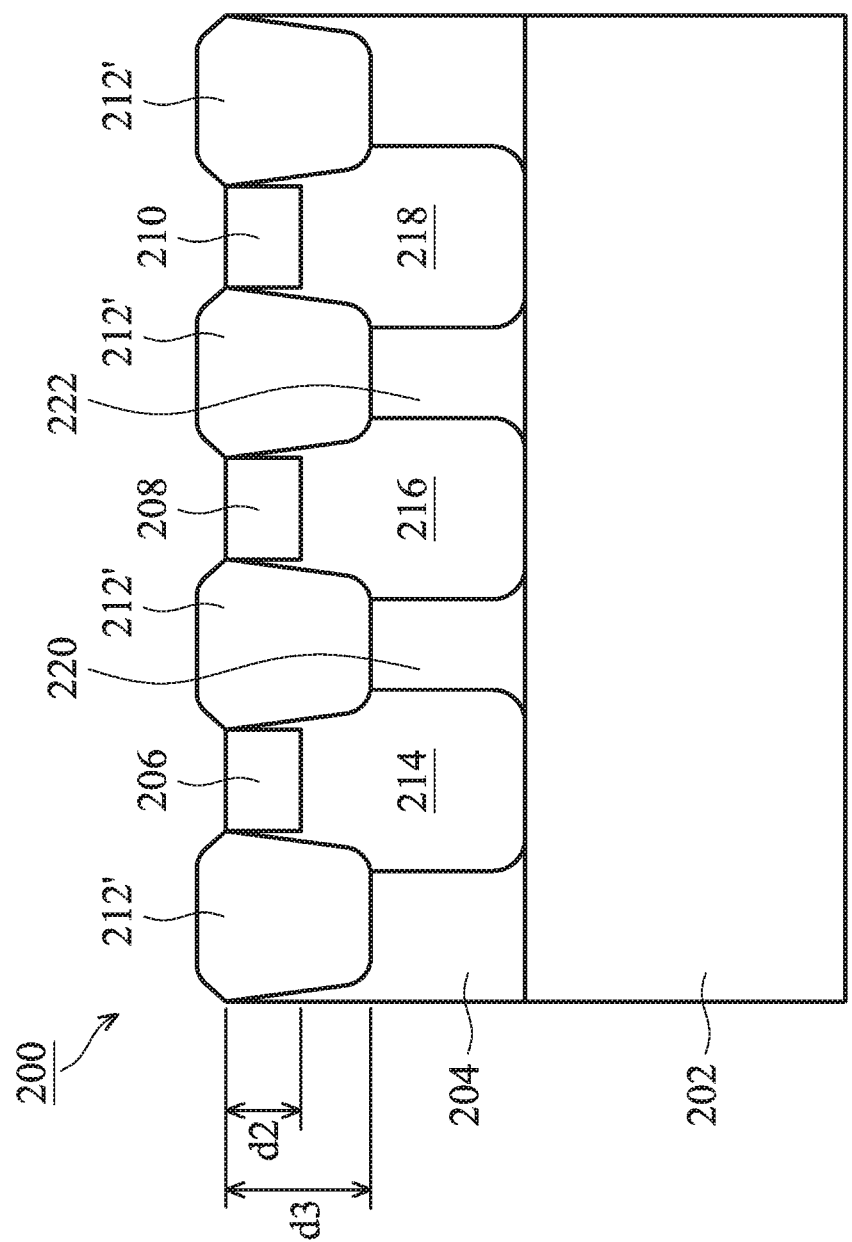
FIG. 11 is a schematic cross section showing an electrostatic discharge (ESD) protection device according to yet another embodiment of the invention.

Moreover, in some embodiments, all of the field oxide (FOX) elements used as the insulating elements 212 shown in FIG. 3 may be replaced by a respective insulating elements 212' using a shallow trench isolation (STI) element made of insulating materials such silicon oxide, see FIG. 11. As shown in FIG. 11, the insulating elements 212' have a depth d3 in the semiconductor layer 204 greater than the depth d2 of the first doped region 206, the second doped region 208, and the third doped region 210 in the semiconductor layer 204. Similarly, in some embodiments (not shown), all of the field oxide (FOX) elements used as the insulating elements 212 shown in FIGS. 4 and 6-10 may be respectively replaced by a shallow trench isolation (STI) elements 212' made of insulating materials such silicon oxide.

Figure 12:
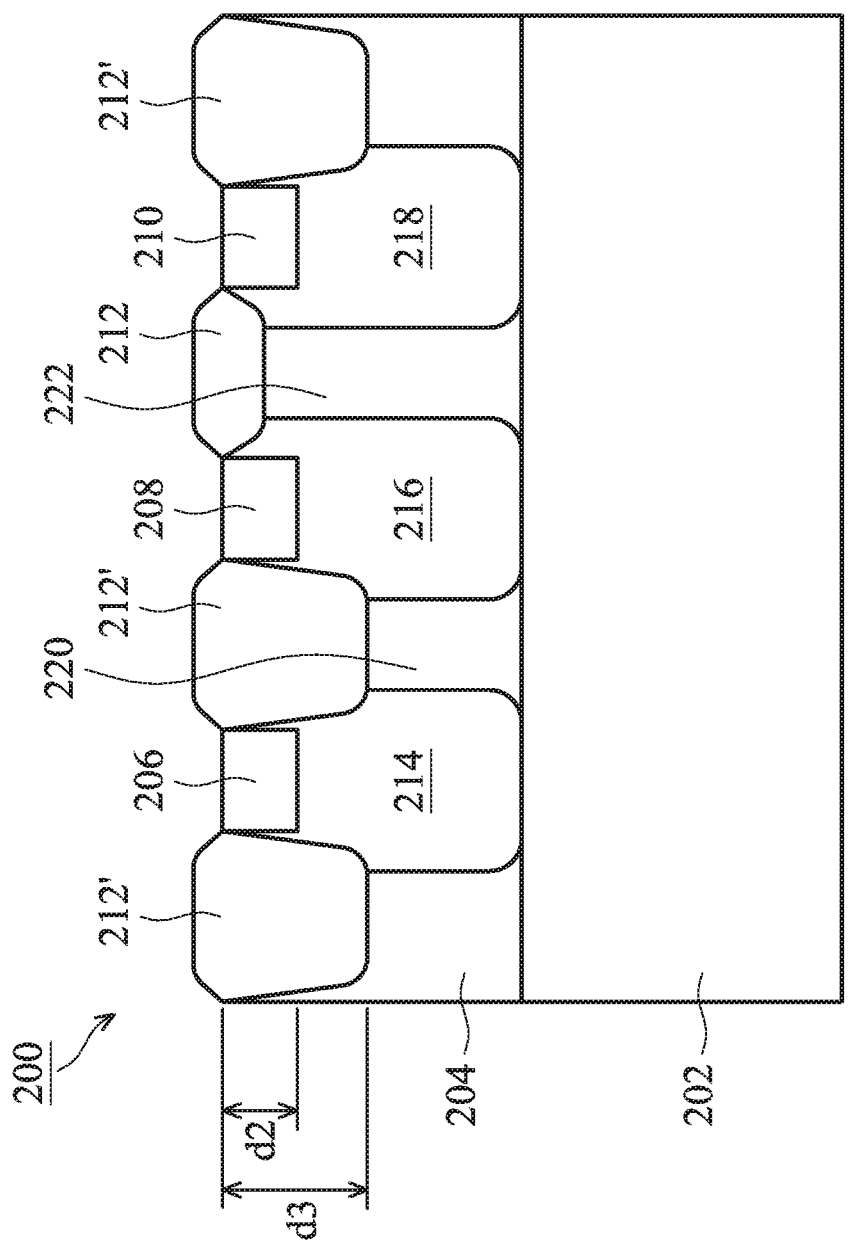
FIG. 12 is a schematic cross section showing an electrostatic discharge (ESD) protection device according to another embodiment of the invention.

In addition, in some embodiments, most of the field oxide (FOX) elements used as the insulating elements 212 shown in FIG. 3 may be replaced by a respective insulating elements 212' using a shallow trench isolation (STI) element made of insulating materials such silicon oxide and at least one insulating element 212 made of the field oxide (FOX) element is still formed in the semiconductor layer 204, see FIG. 12. The at least field oxide element used as the insulating element 212 is preferably formed at a place next to one of the first doped region 206, the second doped region 208, and the third doped region 210 which functions as the collector C of the P-N-P bipolar junction transistor (BJT) 100a shown FIG. 1 or the collector C of the N-P-N bipolar junction transistor (BJT) 100b shown FIG. 2. Similarly, in the embodiments (not shown), most of the field oxide (FOX) elements used as the insulating elements 212 shown in FIGS. 4 and 6-10 may be respectively replaced by the insulating elements 212' using shallow trench isolation (STI) elements and at least one insulating element 212 using field oxide (FOX) elements remain in the ESD protection device 200.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements

What is claimed is:

1. An electrostatic discharge (ESD) protection device, comprising:
    a semiconductor layer;
    a first doped region formed in a first portion of the semiconductor layer;
    a second doped region formed in a second portion of the semiconductor layer;
    a third doped region formed in a third portion of the semiconductor layer;
    a plurality of insulating elements respectively formed in a portion of the semiconductor layer between the first, second and third doped regions; and
    an intrinsic region formed at least in the semiconductor layer between one of the second and third portions of the semiconductor layer and the other one of the second and third portions of the semiconductor layer in the semiconductor layer or between one of the second and third portions of the semiconductor layer and the first portion of the semiconductor layer,
    wherein the first doped region is formed with a first conductivity type, and the second and third doped regions are formed with a second conductivity type opposite to the first conductivity type,
    wherein the intrinsic region is directly below one of the first doped region, the second doped region and third doped region.

2. The ESD protection device as claimed in claim 1, wherein the first conductivity type is N-type and the second conductivity type is P-type, or the first conductivity type is P-type and the second conductivity type is N-type.

3. The ESD protection device as claimed in claim 1, wherein the insulating elements are field oxide (FOX) elements having a depth formed in the semiconductor layer less than a depth of the first, second, and third doped regions formed in the semiconductor layer.

4. The ESD protection device as claimed in claim 1, wherein the insulating elements are shallow trench isolation (STI) elements having a depth formed in the semiconductor layer greater than a depth of the first, second, and third doped regions formed in the semiconductor layer.

5. The ESD protection device as claimed in claim 1, wherein one of the insulating elements is a field oxide (FOX) element having a depth formed in the semiconductor layer less than a depth of the first, second, and third doped regions formed in the semiconductor layer and the other insulating elements are shallow trench isolation (STI) elements having a depth formed in the semiconductor layer greater than a depth of the first, second, and third doped regions formed in the semiconductor layer.

6. The ESD protection device as claimed in claim 5, wherein the field oxide (FOX) element is formed adjacent to at least one of the second and third doped regions.

7. The ESD protection device as claimed in claim 1, wherein the first doped region is formed between the second doped region and the third doped region, or the second doped region is formed between the first doped region and the third doped region, or the third doped region is formed between the first doped region and the second doped region.

8. The ESD protection device as claimed in claim 7, further comprising:
    a first well region formed in a fourth portion of the semiconductor layer under the first portion of the semiconductor layer;
    a second well region formed in a fifth portion of the semiconductor layer under the second region of the semiconductor layer;
    a third well region formed in a sixth portion of the semiconductor layer under the third region of the semiconductor layer,
    wherein the first well region is formed with the first conductivity type or comprises the intrinsic region, and the second well region is formed with the first conductivity type or comprises the intrinsic region, and the third well region is formed with the first conductivity type, the second conductivity type or comprises the intrinsic region.

9. The ESD protection device as claimed in claim 8, further comprising a fourth well region formed in a seventh portion of the semiconductor layer underlying the fourth, fifth, and sixth portions of the semiconductor layer, wherein the fourth well region, the first well region and the second well region comprise the first conductivity type, and the first conductivity type is N-type.

10. The ESD protection device as claimed in claim 8, wherein the first, second and third well regions respectively have a doping concentration that is less than that of the first, second, and third doped regions while the first and second well regions are formed with the first conductivity type, and the third well region is formed with the first conductivity type or the second conductivity type.

11. The ESD protection device as claimed in claim 8, further comprising:
    a fifth well region formed in an eight portion of the semiconductor layer between the first and second well regions; and
    a sixth well region formed in a ninth portion of the semiconductor layer between the second and third well regions,
    wherein the fifth well region is formed with the first conductivity type or comprises the intrinsic region, and the sixth well region is formed with the first conductivity type or comprises the intrinsic region.

12. The ESD protection device as claimed in claim 11, wherein the first, second and third well regions have a doping concentration the same as or greater than a doping concentration of the fifth and sixth well regions.

13. The ESD protection device as claimed in claim 11, further comprising a seventh well region formed in a tenth portion of the semiconductor layer underlying the fourth, fifth, and sixth portions of the semiconductor layer, wherein the seventh well region, the first well region and the second well region comprise the first conductivity type, and the first conductivity type is N-type.

14. The ESD protection device as claimed in claim 11, wherein the first, second, third, fifth and six well regions all comprise the intrinsic region, such that the first, second, and third doped regions are formed in the intrinsic region.

15. The ESD protection device as claimed in claim 1, wherein the first doped region functions as a base, the second doped region functions as an emitter, and the third doped functions as a collector during an ESD event.

16. An electrostatic discharge (ESD) protection device, comprising:
a semiconductor layer;
a first doped region formed in a first portion of the semiconductor layer;
a second doped region formed in a second portion of the semiconductor layer;
a third doped region formed in a third portion of the semiconductor layer;
a plurality of insulating elements respectively formed in a portion of the semiconductor layer between the first, second and third doped regions; and
an intrinsic region formed at least in the semiconductor layer between one of the second and third portions of the semiconductor layer and the other one of the second and third portions of the semiconductor layer in the semiconductor layer or between one of the second and third portions of the semiconductor layer and the first portion of the semiconductor layer,
wherein the first doped region is formed with a first conductivity type, and the second and third doped regions are formed with a second conductivity type opposite to the first conductivity type,
wherein one of the insulating elements is a field oxide (FOX) element having a depth formed in the semiconductor layer less than a depth of the first, second, and third doped regions formed in the semiconductor layer and the other insulating elements are shallow trench isolation (STI) elements having a depth formed in the semiconductor layer greater than a depth of the first, second, and third doped regions formed in the semiconductor layer.

17. The ESD protection device as claimed in claim 16, wherein the field oxide (FOX) element is formed adjacent to at least one of the second and third doped regions.

18. An electrostatic discharge (ESD) protection device, comprising:
a semiconductor layer;
a first doped region formed in a first portion of the semiconductor layer;
a second doped region formed in a second portion of the semiconductor layer;
a third doped region formed in a third portion of the semiconductor layer;
a plurality of insulating elements respectively formed in a portion of the semiconductor layer between the first, second and third doped regions;
an intrinsic region formed at least in the semiconductor layer between one of the second and third portions of the semiconductor layer and the other one of the second and third portions of the semiconductor layer in the semiconductor layer or between one of the second and third portions of the semiconductor layer and the first portion of the semiconductor layer,
wherein the first doped region is formed with a first conductivity type, and the second and third doped regions are formed with a second conductivity type opposite to the first conductivity type,
wherein the first doped region is formed between the second doped region and the third doped region, or the second doped region is formed between the first doped region and the third doped region, or the third doped region is formed between the first doped region and the second doped region;
a first well region formed in a fourth portion of the semiconductor layer under the first portion of the semiconductor layer;
a second well region formed in a fifth portion of the semiconductor layer under the second region of the semiconductor layer; and
a third well region formed in a sixth portion of the semiconductor layer under the third region of the semiconductor layer,
wherein the first well region is formed with the first conductivity type or comprises the intrinsic region, and the second well region is formed with the first conductivity type or comprises the intrinsic region, and the third well region is formed with the first conductivity type, the second conductivity type or comprises the intrinsic region.

19. The ESD protection device as claimed in claim 18, further comprising a fourth well region formed in a seventh portion of the semiconductor layer underlying the fourth, fifth, and sixth portions of the semiconductor layer, wherein the fourth well region, the first well region and the second well region comprise the first conductivity type, and the first conductivity type is N-type.

20. The ESD protection device as claimed in claim 18, wherein the first, second and third well regions respectively have a doping concentration that is less than that of the first, second, and third doped regions while the first and second well regions are formed with the first conductivity type, and the third well region is formed with the first conductivity type or the second conductivity type.

21. The ESD protection device as claimed in claim 18, further comprising:
a fifth well region formed in an eight portion of the semiconductor layer between the first and second well regions; and
a sixth well region formed in a ninth portion of the semiconductor layer between the second and third well regions,
wherein the fifth well region is formed with the first conductivity type or comprises the intrinsic region, and the sixth well region is formed with the first conductivity type or comprises the intrinsic region.

22. The ESD protection device as claimed in claim 21, wherein the first, second and third well regions have a doping concentration the same as or greater than a doping concentration of the fifth and sixth well regions.

23. The ESD protection device as claimed in claim 21, further comprising a seventh well region formed in a tenth portion of the semiconductor layer underlying the fourth, fifth, and sixth portions of the semiconductor layer, wherein the seventh well region, the first well region and the second well region comprise the first conductivity type, and the first conductivity type is N-type.

24. The ESD protection device as claimed in claim 21, wherein the first, second, third, fifth and six well regions all comprise the intrinsic region, such that the first, second, and third doped regions are formed in the intrinsic region.

* * * * *